United States Patent [19]
Sasaki

[11] Patent Number: 5,787,381
[45] Date of Patent: *Jul. 28, 1998

[54] CONTROL APPARATUS FOR AUTOMOBILE ENGINE INCLUDING MICROCOMPUTER WHICH MAY BE PROGRAMMED AFTER MOUNTING ON A CIRCUIT BOARD

[75] Inventor: Shoji Sasaki, Katsuta, Japan

[73] Assignee: Hitachi, Ltd., Tokyo, Japan

[*] Notice: The term of this patent shall not extend beyond the expiration date of Pat. No. 5,602,738.

[21] Appl. No.: 721,324

[22] Filed: Sep. 26, 1996

Related U.S. Application Data

[63] Continuation of Ser. No. 141,703, Oct. 27, 1993, Pat. No. 5,602,738, which is a continuation of Ser. No. 647,564, Jan. 29, 1991, abandoned.

[30] Foreign Application Priority Data

Feb. 1, 1990 [JP] Japan ................................. 2-020416

[51] Int. Cl.⁶ .................... G06F 19/00; G06F 13/00; G11C 17/18
[52] U.S. Cl. .................... 701/115; 711/103; 701/102; 365/52; 365/189.03
[58] Field of Search ............................. 395/430; 365/51, 365/52, 189.03, 201; 364/431.04, 431.12

[56] References Cited

U.S. PATENT DOCUMENTS

| | | | |
|---|---|---|---|
| 4,325,130 | 4/1982 | Tiltscher | 711/103 |
| 4,349,870 | 9/1982 | Shaw et al. | 395/800.38 |
| 4,498,151 | 2/1985 | Henry | 711/103 |
| 4,671,235 | 6/1987 | Hosaka | 123/352 |
| 4,677,558 | 6/1987 | Bohmler | 701/107 |
| 4,698,750 | 10/1987 | Wilkie et al. | 711/166 |
| 4,751,633 | 6/1988 | Henn et al. | 395/182.16 |
| 4,785,425 | 11/1988 | Lavelle | 365/52 |
| 4,794,558 | 12/1988 | Thompson | 395/800.37 |
| 4,809,231 | 2/1989 | Shannon et al. | 365/201 |
| 4,905,191 | 2/1990 | Arai | 365/201 |
| 5,019,799 | 5/1991 | Oshiage et al. | 340/438 |
| 5,050,080 | 9/1991 | Abe | 701/115 |
| 5,602,738 | 2/1997 | Sasaki | 701/115 |

FOREIGN PATENT DOCUMENTS

| | | |
|---|---|---|
| 2916658 | 10/1979 | Germany . |
| 56-7295 | 1/1981 | Japan . |
| 61-264594 | 11/1986 | Japan . |
| 63-18889 | 8/1988 | Japan . |

*Primary Examiner*—Glenn Gossage
*Attorney, Agent, or Firm*—Antonelli, Terry, Stout, & Kraus, LLP

[57] ABSTRACT

A control apparatus and associated method for controlling an internal combustion engine of an automobile. A single chip microcomputer has a memory, which may be a programmable read only memory (PROM), for storing data and is operable in accordance with program data stored in the memory. The data may be stored in the memory after the microcomputer has been mounted on a circuit board. The control apparatus includes the microcomputer with its memory, a control unit for controlling the storing of program data into the memory, a plurality of input terminals for receiving the program data from an external source, and isolation circuitry for isolating the microcomputer during writing of program data into the memory. The microcomputer receives data from external sensors which sense operating conditions of the automobile and applies signals to external actuators to control operating conditions of the engine.

7 Claims, 5 Drawing Sheets

CONTROL APPARATUS FOR AUTOMOBILE ENGINE INCLUDING MICROCOMPUTER WHICH MAY BE PROGRAMMED AFTER MOUNTING ON A CIRCUIT BOARD

This application is a Continuation of application Ser. No. 08,141,703, filed Oct. 27, 1993, now U.S. Pat. No. 5,602,738 which is a Rule 62 Continuation of application Ser. No. 07/647,564 filed Jan. 29, 1991, now abandoned.

BACKGROUND OF THE INVENTION

The present invention generally relates to a microcomputer control apparatus and an associated method for achieving a required control function by processing a program by way of a single chip microcomputer. More specifically, the present invention is directed to a microcomputer control apparatus and an associated method suitable for use in an engine control, of an automobile.

As is well known, programs are necessarily required for apparatuses which use computers.

Often, a central processing unit (CPU) employing therein a masked ROM (read-only memory), into which a program has been written during a manufacturing step, is used as a single chip microcomputer in a conventional control apparatus. However, this method may result in problems, since in a so-called "multi-sort/small quantity production" system, a considerable development cost is required, a lengthy development time is needed for modifying the program, thereby lowering the yield, and furthermore modifications of the program are not achieved with flexibility. Accordingly, in for example, engine control apparatuses, it is common to employ a CPU with an EPROM in which a program is readily rewritable. In this case, a choice may be made between one control apparatus with a multi-chip type microcomputer in which a PROM and a CPU are separately employed and an other control apparatus with a single chip type microcomputer in which a PROM is built in a CPU.

When program data is written into a single chip type microcomputer, before this computer is mounted or packaged on a circuit board, a predetermined exclusively-used jig is employed so as to permit electrical access to the PROM.

These types of apparatus are known in the art from, for instance,

JP-A-56-7295,

JP-A-61-264594, and

JP-A-63-188894.

SUMMARY OF THE INVENTION

The above-described prior art merely discloses the data writing operations into PROMs. As a consequence, although the operation of writing data in PROMs effected in multi-chip type microcomputers is known, there is no specific disclosure of the program data being written into a PROM built in a CPU of a single-chip type microcomputer.

Very recently, a PLCC (Plastic Leader Chip Carrier) package type single chip CPU, known as an "H8" (trademark for a device manufactured by Hitachi, Ltd.), has been commercially available. Lead pitches of this PLCC package type CPU are much narrower than those of the above-described conventional chip, and so there is a likelihood that the leads may be deformed when the exclusively-used jig is engaged/disengaged with the chip when program data is to be written, and thus the leads may be short-circuited and also soldering defects may occur.

Also, when soldering the PLCC package type chips during the manufacturing stage of the circuit board, these chips must be treated in such a severe environment that the ambient temperature may reach approximately 250° C. If moisture is contained in the PLCC packaging material, the moisture will expand. Then, in the worst case, there is a risk that a crack may be produced in the PLCC package. As a consequence, stringent moisture control is necessarily required so as to employ the PLCC package type chips. Thus, it is common that such a PLCC package element must be held within a sealed vessel (package) containing a desiccating agent just before being treated. In the above-described conventional techniques, after the chip element has been taken out from the sealed vessel, the program data writing operation for the PROM is executed before the chip is treated. As a result, there is a possibility that the PLCC package may absorb moisture during the time period required for the writing operation, and therefore the package may be destroyed, e.g., cracked, and the reliability there of may be lowered.

Furthermore, after such a package element has been soldered on the circuit board, the element cannot be replaced on the circuit board by another element. That is to say, in case of replacement, the replacement element must be manually soldered on the circuit board. At this time, the soldering operations of the PLCC package elements may cause such difficulties that a soldering bridge occurs, and excess soldering will be done, or insufficient soldering will be done, thereby deteriorating durability.

As a consequence, if the soldering defect or incorrect element positioning are found after the soldering treatment, the entire circuit board with such an incorrectly-set chip must be thrown out. In such a case, the total cost of the disposed circuit board may be several tens times higher than the cost of a single element. On the other hand, in a case in which engine control apparatuses for automobiles are manufactured, depending upon the types of automobiles, in a multi-type/small quantity production system, the total number of different program data to be written into a PROM employed in a single chip CPU amounts to several tens of program types. Accordingly, there is a high probability that the chip elements into which the program data have been written may be mounted on the incorrect circuit board. Thus, there is an expense in disposing of such erroneously-assembled circuit boards.

Moreover, there is a need to be able to modify a program after assembling a microcomputer in a circuit board in the case of an engine control apparatus for an automobile. In such a case, this circuit board must be replaced by a new circuit board on which a microcomputer into which the modified program has been written is mounted, whereby difficult replacement is required and a higher cost may be incurred.

SUMMARY OF THE INVENTION

An object of the present invention is to provide a microcomputer control apparatus and a method for eliminating the above-described drawbacks of the conventional techniques.

Another object of the present invention is to provide a microcomputer control apparatus and a method capable of writing data with respect to a programmable memory employed in a single chip CPU after packaging this single chip CPU on a circuit board.

A further object of the present invention is to readily provide such a microcomputer control apparatus and a method that even when a PLCC package type single chip microcomputer is employed, there is no risk of cracking of the package, no risk of a soldering defect, and no risk of erroneously assembling the CPU, and yet low cost and high reliability are achieved.

To achieve the above-described objects, according to a feature of the present invention, in a microcomputer control apparatus with a single chip CPU containing therein a programmable memory, there is provided a data writing unit capable of writing data into the above-described memory after the single chip CPU has been mounted on a circuit board.

As a consequence, since after the CPU element has been packaged on the circuit board, the data such as program data may be readily written into the PROM contained in the single chip CPU element, both lower reliability of the microcomputer control apparatus and increased manufacturing cost due to occurrence of defects may be avoided. In other words, since the data may be written into the CPU after packaging the CPU on the circuit board, there is no need to employ an exclusively used jig for the data writing purpose, so that the above-described deformation of the leads of the CPU element caused when the jig is engaged/disengaged with the CPU element may be avoided, and moreover a short-circuit occurring among the leads, as well as a soldering defect, may be avoided.

In addition, when the single chip CPU is of a PLCC package type, since the package element may be within the sealed vessel just before being treated in the vapor flowing stage, the hygroscopic phenomenon of the package element may be minimized, and therefore destroying of the package element during heating may be avoided. Also, since the data is written into the CPU element after packaging this CPU element on the circuit board and a unique component, e.g., a pin, is provided in accordance with the type of data to be written, the correct data may be written into the desired CPU element packaged on the correct circuit board. As a result, even when the microcomputer control apparatuses must be manufactured in accordance with a multi-sort/small quantity production system, it is possible to prevent the data being erroneously written into a different type of the circuit board with the CPU element.

In accordance with another feature of the control apparatus of the present invention, the above-explained single chip microcomputer is equipped with two different operation modes, i.e., a single chip mode and a write mode to the above-described memory, and also the above-described data write unit includes an operation mode changing unit for selecting between these operation modes.

The data write unit preferably includes a conducting pattern formed on the circuit board so as to input an operation mode changing signal into the above-described changing unit.

Furthermore, the data write unit preferably includes another conducting pattern formed on the circuit board in order to input the data into the memory when the single chip microcomputer has been switched into the memory write mode.

Moreover, the data write unit preferably includes a circuit unit for isolating a peripheral circuit of the single chip microcomputer from the main body while the data is written into the memory by the data write unit.

According to another feature of the control apparatus of the present invention, the single chip microcomputer is equipped with a serial communication unit capable of inputting serial data, and the data write unit may write data received by the serial communication unit into the memory.

The single chip microcomputer is preferably capable of two different types of operation modes including the single chip mode and the write mode to the memory, the data write unit includes an operation mode changing unit for selecting between these operation modes, and furthermore in response to an operating mode changing signal from an external source, the microcomputer supplies a control signal to the operation mode changing unit to change the operation mode.

DESCRIPTION OF PREFERRED EMBODIMENTS

Referring now to preferred embodiments shown in figures, microcomputer control apparatuses according to the present invention will be described in detail.

Figure 1:
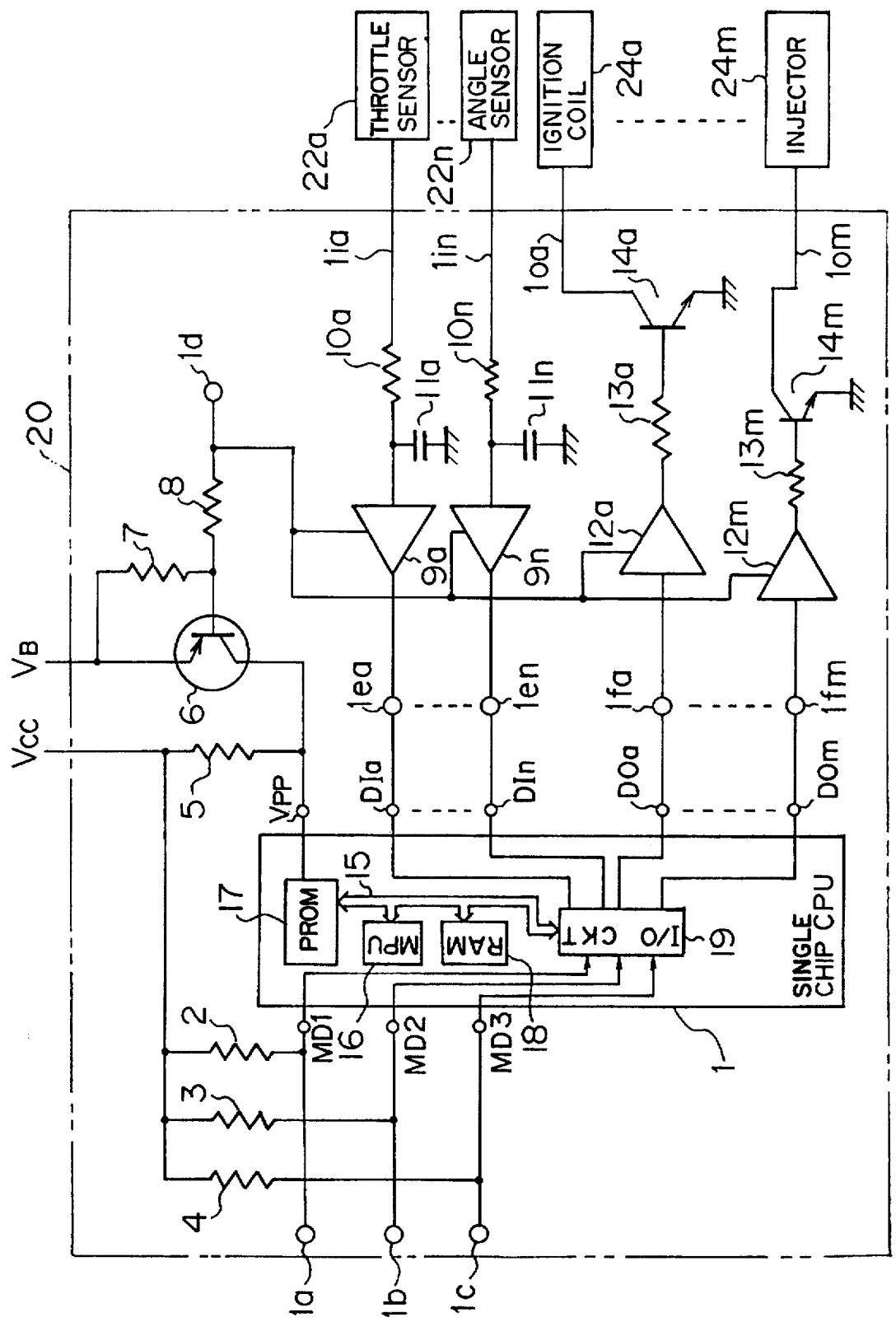
FIG. 1 is a schematic diagram representing a construction of a microcomputer control apparatus according to a preferred embodiment of the present invention.

FIG. 1 represents a construction of one preferred embodiment of the present invention, and such an embodiment of the present invention has been applied to an internal combustion engine control apparatus for an automobile.

In this figure, reference numeral 20 denotes a microcomputer control apparatus according to the present invention which has been packaged on a circuit board. Reference numeral 1 indicates a single chip CPU in which a programmable memory, for instance, a PROM (programmable read-only memory), 17 has been built. It should be noted that a single chip CPU, known as "H8", manufactured by Hitachi Co., Ltd., has been employed in this preferred embodiment. The CPU 1 further employs a microprocessing unit (MPU) 16, a random access memory (RAM) 18, an input/output (I/O) circuit 19 and a bus 15.

The CPU 1 has a "write mode" capable of writing data into a built-in PROM, and an "expand mode", in addition to a "single chip mode" corresponding to a normal mode under which a normal engine controlling computer is operated by a program stored in the built-in PROM. There are three mode terminals MD1, MD2 and MD3 provided for selecting these modes, and they are connected to terminal lands 1a, 1b and 1c which have been formed as conducting patterns on the circuit board. As the input conditions to these terminals, the three terminal MD1, MD2 and MD3 are set to "High" levels in the single chip mode and are set to "Low" levels in the write mode. To achieve the single chip mode under such a condition that no input is given to these terminal lands 1a to 1c, the terminals MD1, MD2 and MD3 are connected via pull-up resistors 2–4 to a power supply Vcc. The terminals MD1 to MD3 are connected to the I/O circuit 19.

Reference numeral 6 indicates a switching element for switching a power supply, e.g., a bipolar transistor, which functions to switch a power supply voltage Vcc required for the normal operation condition of PROM 17 and a power supply voltage $V_B$ required for the writing operation of the PROM. That is to say, when this transistor 6 is turned OFF, the voltage of a terminal $V_{PP}$ is maintained at the voltage Vcc due to the operation of the pull-up resistor 5, and when the transistor 6 is turned ON, this terminal voltage $V_{PP}$ is kept at a voltage $V_B$.

It should be noted that in the above-described CPU known as "H8", these supply voltages are set as follows:

$V_B$=12.5 V

Vcc=5.0 V.

Then, the turning ON/OFF states of the transistor 6 is controlled by an input to the terminal land 1d. In other words, when this land 1d is kept open, since the base potential of the transistor 6 becomes the same as the emitter potential thereof due to a resistor 7, the transistor 6 is turned OFF, and terminal $V_{PP}$ is maintained at the power supply voltage $V_{CC}$ required for the normal operation mode or condition of PROM 17. When the land 1d is grounded, since the base current flows through a resistor 8, this transistor 6 is turned ON, and terminal $V_{PP}$ is kept at the power supply voltage $V_B$ required for the writing operation of PROM 17. Transistor 6 and resistors 5, 7, and 8 thus may be considered a write control circuit for controlling the PROM to permit writing of a control program into the PROM. It should be noted that the power supply voltage Vcc is applied to other elements of the CPU 1. Reference numerals 9a to 9n indicate 3-state buffers between terminal lands 1ea to 1en, to which a plurality of digital signal input terminals DI (DIa to DIn) of the CPU 1 have been connected, and digital signal input lines 1ia to 1in. The 3-state buffers 9a to 9n have the function of electrically isolating the corresponding terminal lands 1ea to 1en from the digital signal input lines 1ia and 1in, if required. The lands 1ea to 1en and 1fa to 1fm have been fabricated as conducting patterns on the circuit board. Reference numerals 12a to 12m are similarly buffers and are interposed between the terminal lands 1fa to 1fm, to which are connected digital signal output terminal DO (DOa to DOm) of the CPU 1, and digital signal output lines 1oa to 1om. Buffers 12a to 12m electrically isolate the corresponding terminal lands 1fa to 1fm from the digital signal output lines 1oa to 1om. These elements are packaged on the circuit board. Input lines 1ia to 1in are connected to the respective sensors, for instance the input lines 1ia and 1in are connected to a sensor 22a for measuring an opening degree or angle (Θth) of a throttle valve, and an angle sensor 22n for outputting a sensor signal in synchronism with a revolution angle of an engine, respectively. Output lines 1oa to 1om, are connected to an actuator of the engine, or the like, for example, the output lines 1oa and 1om are connected to an ignition coil 24a and a fuel injector 24m.

Now, an operation of this preferred embodiment will be described.

First, this CPU 1 is mounted on an engine of an automobile. Under control of this CPU 1, namely in the single chip or normal operating mode, terminals DI and DO become data input terminals and data output terminals. That is to say, the CPU 1 performs the calculation based upon the input signals supplied from the sensors 22a and 22n to the terminals DI and outputs a calculation result via the output terminals DO to the actuators 24a to 24n. On the other hand, when the normal operation mode is changed into the writing mode, the respective terminals DI are switched into, for instance, the data bus, and then the terminals DO are switched into the address bus. It should be noted that the terminals DI and DO may be switched to the address bus and data bus, respectively. As previously explained, to set the write mode, all of the terminal lands 1a, 1b and 1c are merely kept at a ground level.

In accordance with this preferred embodiment, as previously stated, the lands 1ea to 1en and 1fa to 1fm have been formed on the circuit board in connection with the terminals DI and DO which are to be switched over to the address bus and data bus, and these terminals DI and DO are connected to these lands.

Figure 2A:
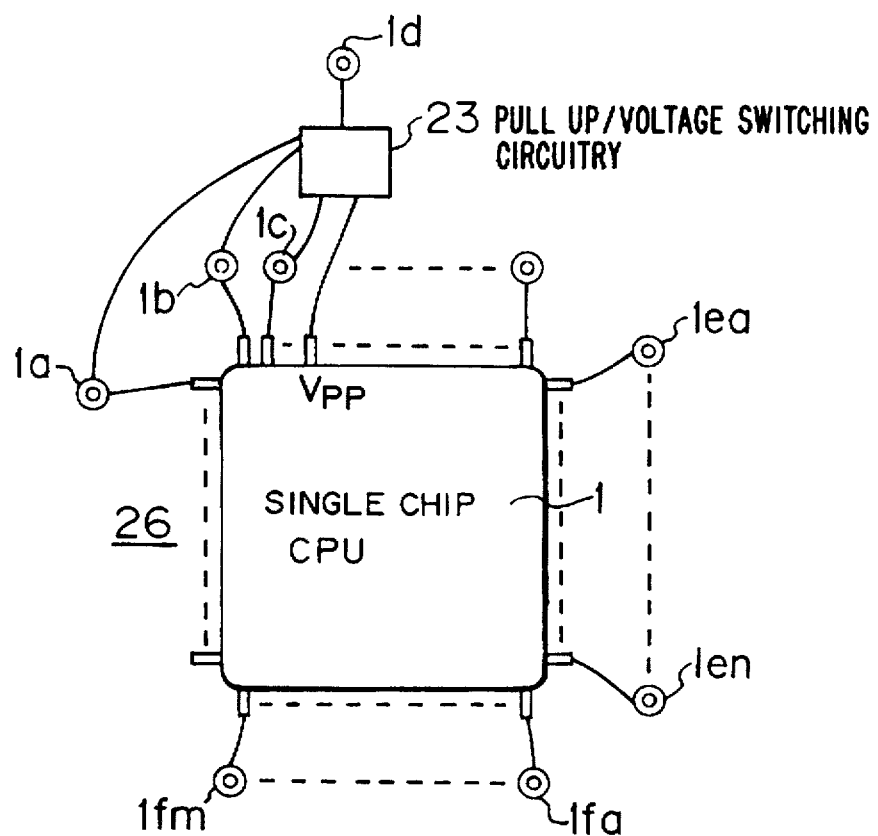
FIG. 2A is a plan view illustrating the positioning of the microcomputer control apparatus of FIG. 1 on a circuit board.
Figure 2B:
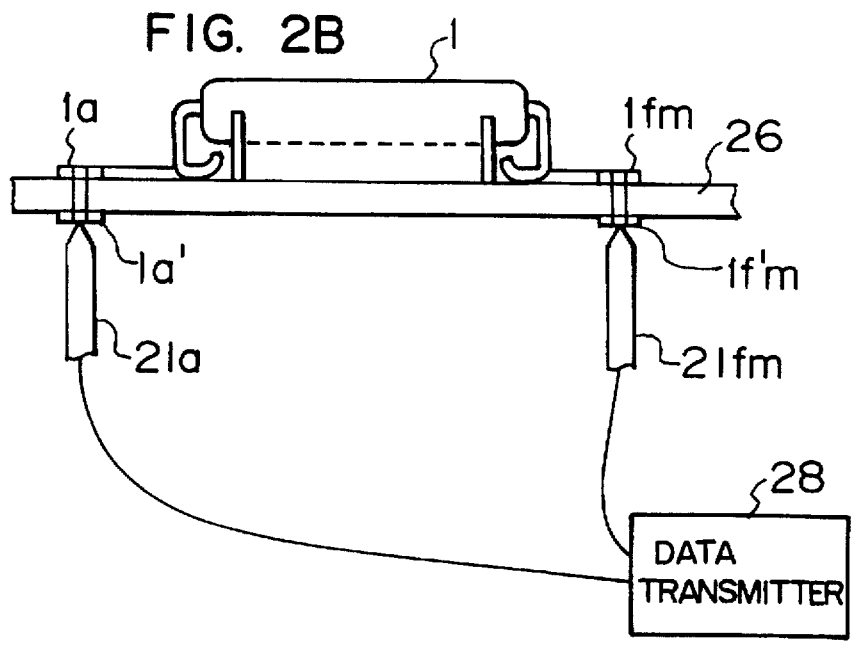
FIG. 2B is a side view thereof.

There are shown in FIGS. 2A and 2B, the control apparatus 20, including the CPU 1, on a circuit board 26.

In FIG. 2A, the CPU 1 is mounted by soldering the leads thereof on the conducting patterns of the circuit board 26. These conducting patterns connect between the associated circuit elements and the lands soldered with the respective leads. Then, the lands 1a to 1fm are formed on a predetermined portion of this selected pattern. In FIG. 2A, a block 23 represents a circuit constructed of resistors 2 to 5, 7 and 8, and also the transistor 6. In accordance with this preferred embodiment, as is apparent from especially FIG. 2B, these lands 1a to 1fm provide through holes from one surface of the circuit board 26 on which the CPU 1 has been mounted to the opposite surface thereof, and furthermore, lands 1a' to 1fm' have been manufactured on this opposite surface, in correspondence to the above-described lands 1a to 1fm.

Also, in FIG. 2B, reference numerals 21a to 21fm indicate electrode pins for data writing purposes. The electrode pins 21a to 21fm are in electrical contact with the lands 1a' to 1fm'. Each of these electrode pins is connected to a data transmitter 28, for instance a ROM writer.

On the circuit board 26, the CPU 1 and the like have been mounted in contact with the electrode pins 21a to 21fm, corresponding to each lands 1a' to 1fm', as represented in FIG. 2B. Among them, only the electrode pins 21a to 21d, connected to the lands 1a to 1d shown in FIG. 1, are selected and grounded so as to be at a "Low" level. Thus, as previously described, the operation mode of the CPU 1 is transferred into the "write mode," and also the CPU 1 is brought into such a condition that the write voltage $V_{BB}$ is applied to the terminal $V_{PP}$.

Then, under this state, predetermined address data are inputted to the electrode pins 21ea to 21em connected to the terminals DOa to DOm, and also predetermined program data are inputted to the electrode pins 21fa to 21fm connected to the terminals DIa to DIm, from the data transmitter 28 as parallel data, so that a program required for the PROM 17 employed in the CPU 1 may be written therein.

As a result, in accordance with this preferred embodiment, after the CPU has been packaged on the circuit board 26, writing the program into the PROM 17 employed in the CPU 1 may be accomplished without using a jig. As a consequence, the vapor reflowing stage is carried out just after the CPU 1 has been taken out from a sealing vessel, and thereafter the data writing operation is performed. As a consequence, the hygroscopic time of a package may be kept to a minimum time, whereby package cracking occurring in the vapor reflowing stage may be prevented, and there is no risk of deforming leads, and the reliability of the final product may be sufficiently maintained.

First, as described above, the buffers 9a to 9n are 3-state buffers, and each of the control terminals thereof is connected to the land 1d. When the land 1d is, for instance, at a "Low" level, the outputs of the buffers are in a high impedance (open) state, whereas when the land id is at a "High" level, they function as normal buffers. As a consequence, when the land 1d is opened and the CPU 1 is selected to be in the single chip mode, the data derived from the digital signal input lines 1ia to 1in are directly inputted to the terminal DIa to DIn. On the other hand, when the land 1d is grounded and the CPU 1 is brought into the write mode, the lands 1ea to 1en are electrically isolated from the digital signal input lines 1ia to 1in, and also the waveforms of the program inputted from the electrode pins 21ea to 21en into these lands 1ea to 1en are not distorted due to the adverse influences of the resistors 10a to 10n and capacitors 11a to 11n present in the digital signal input lines 1ia to 1in.

Similarly, when the inputs of the buffers 12a to 12n are high impedances, the address data which have been inputted from the electrode pins 21fa to 21fm into the lands 1fa to 1fm are not adversely influenced by the resistors 13 and transistors 14 present in the digital signal output lines 1oa to 1om.

It should be noted that respective pairs of resistors 10a to 10n and capacitors 11a to 11n constitute filters; resistors 13a to 13m are base resistors for transistors 14a to 14m for driving the actuators 24a to 24m.

Accordingly, in accordance with this preferred embodiment, since after the control apparatus 20 and like have been packaged on the circuit board, the writing operation may be executed, the correct program data may be continuously written, and high reliability may be easily achieved. Also, even after the data such as program data have been written, these written data may readily be rewritten by way of the above-described method so as to be modified.

It should be noted that if a memory which may be written under the power supply voltage Vcc is employed as the programmable memory (PROM), then the transistor 6, resistors 7 and 8, and land id may be omitted, and the control terminals of the buffers 9a to 9n may be connected to any one of the lands 1a to 1c.

It should also be noted that the quantity of lands 1ea to 1en is equal to the number of bits in the program data, and also the quantity of lands 1fa to 1fm is equal to the number of bits in the address data. Thus, although the lands 1ea to 1en shown in FIG. 1 were connected to all of the input lines 1ia to 1in, a part of these lands 1ea to 1en may be brought into an open state in case the number of sensors 22 is smaller than the number of bits in the program data. Similarly, a portion of the lands 1fa to 1fm may be set to an open condition when the number of actuators 24 is smaller than the number of bits in the address data.

Conversely, in case the number of sensors 22 is larger than the number of bits in the program data, the total number of lands 1e may be equal to the number of bits in the program data. Similarly, when the quantity of actuators 24 is greater than the number of bits in the address data, the total number of lands 1f may be equal to the number of bits in the address data.

Figure 3:
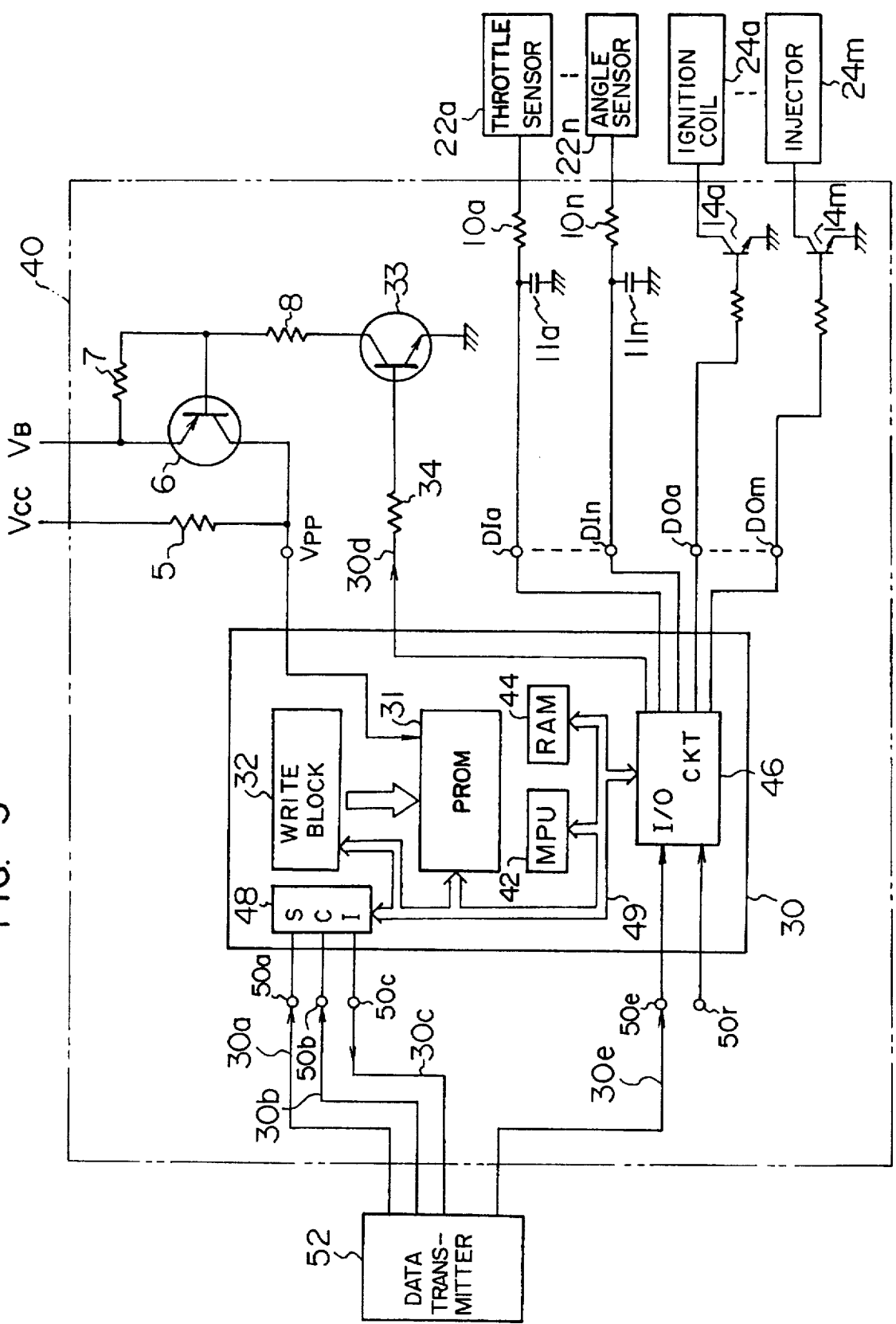
FIG. 3 is a schematic diagram representing another construction of a microcomputer control apparatus according to another preferred embodiment of the present invention.

FIG. 3 is a schematic block diagram representing another preferred embodiment of the present invention. It should be noted that the same reference numerals shown in FIG. 1 are employed for denoting the same circuit elements represented in FIG. 3.

Although the program data and address data are inputted in parallel form to the terminals DI and DO in the embodiment shown in FIG. 1, a single chip CPU has a serial communication function, and serial data are written by serial communication in this preferred embodiment. In FIG. 3, reference numeral 30 denotes a CPU (central processing unit) for constituting a single chip microcomputer; reference numeral 31 indicates a programmable memory built in the CPU 30, for instance a PROM (programmable ROM); reference numeral 32 represents a write block, e.g. a mask ROM built in the CPU 30; reference numeral 42 is a MPU (microprocessor unit); reference numeral 44 indicates a RAM (random access memory); reference numeral 46 represents an I/O (input/output) circuit; reference numeral 48 denotes a serial communication interface (SCI); and reference numeral 49 is a bus.

It is so arranged that serial data which has been externally read by way of the serial communication of SCI 48 is inputted into PROM 31, and a predetermined program may be written therein. It should be noted that this write block may be arranged by a logic circuit, instead of the above-described mask ROM.

A terminal $V_{PP}$, which is an input to the CPU 30, is connected to both a pull-up resistor 5 and the collector of a transistor 6, similar to the preferred embodiment in FIG. 1. As a consequence, when data is written into the PROM 31, a voltage $V_B$ required for this data writing operation is changed from the voltage Vcc so as to be applied thereto. It is so designed that this transistor 6 is controlled by the CPU 30 per se, whereby there are provided switching elements, for instance, a transistor 33 and a resistor 34. Thus, when the CPU 30 is brought into the writing mode, the CPU automatically outputs a $V_{PP}$ control signal 30d so that the transistor 33 is turned ON and the transistor 6 is brought to an ON state, and furthermore the voltage appearing at the terminal $V_{PP}$ is changed from Vcc to $V_B$.

Input/output terminals 50a, 50b and 50c of the CPU 30 are employed so as to perform data transmission by way of the above-described serial communication function. A serial data signal 30a to be written into the PROM 31 is inputted into the input terminal 50a; a data clock 30b is inputted into an input terminal 50b, and a serial data signal 30c is outputted from the output terminal 50c. An input terminal 50e serves as an input terminal for a write mode signal 30e used for switching the CPU 30 into the write mode. When this input signal 30e is set to, for instance, a "Low" level, the operation mode of the CPU 30 is changed into the write mode, whereas when this input signal 30e is set to a "High" level, the operation mode thereof is returned to the single chip or normal operating mode. This signal 30e may be replaced by signals inputted to terminals MD1, MD2 and MD3. These signals 30a, 30b and 30e are supplied from a data transmitter 52, and the signal 30c is furnished to it. It should be noted that a terminal 50r is a reset terminal and this control apparatus 40 is fabricated on a circuit board.

Subsequently, a writing operation to the PROM 31, executed after the control apparatus has been mounted on the circuit board, will now be described with reference to flowcharts shown in FIGS. 4 and 5.

Figure 4:
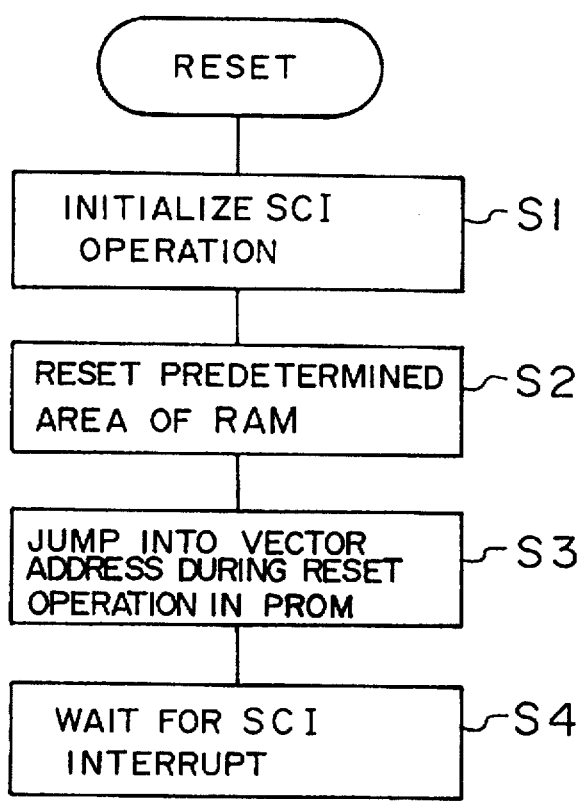
FIG. 4 is a flowchart for explaining a resetting operation of the microcomputer control apparatus shown in FIG. 3; and, FIG. 5 is a flowchart for explaining an SCI interrupt operation of the apparatus shown in FIG. 3.
Figure 5:
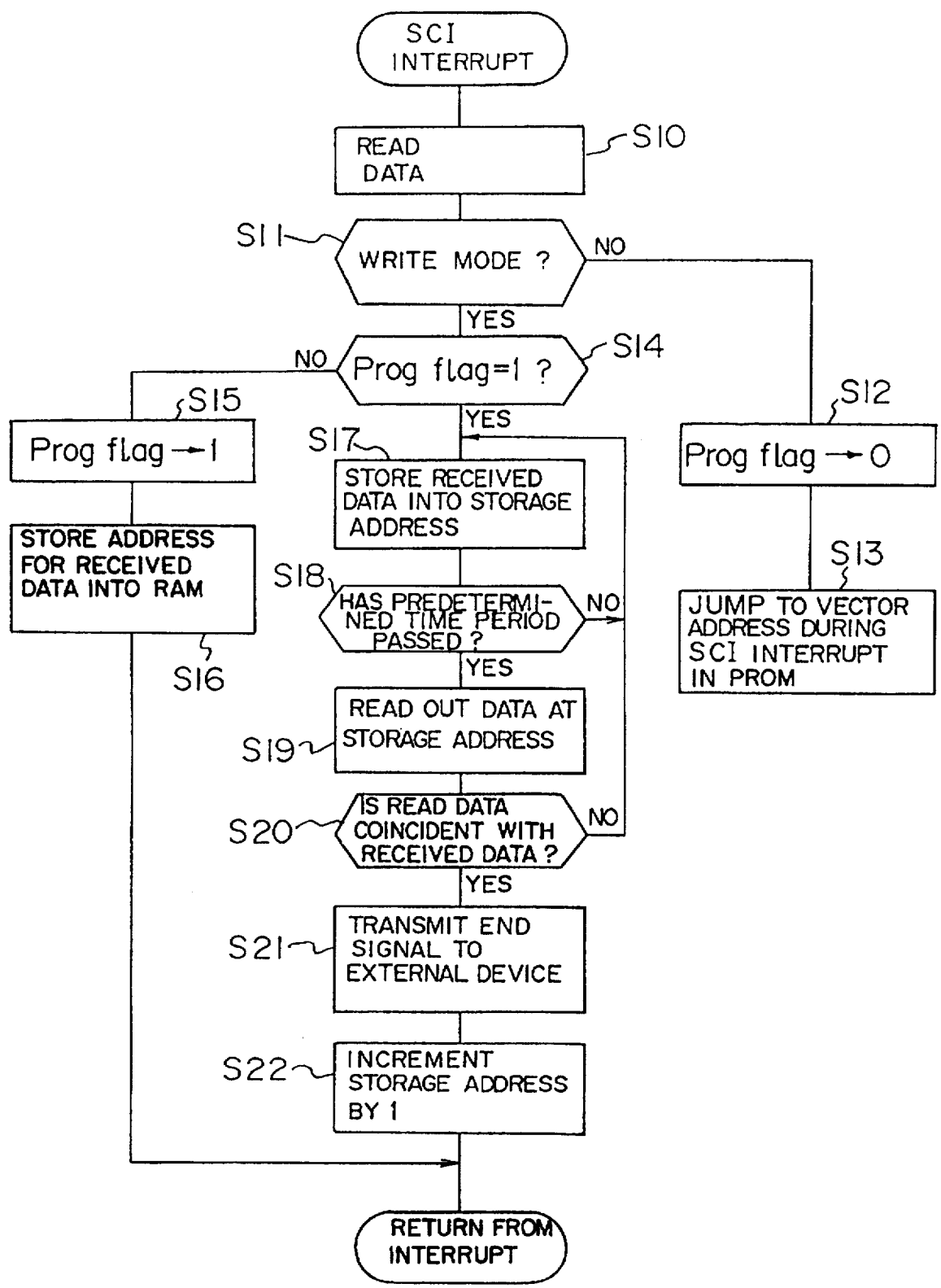

Operations represented in FIGS. 4 and 5 are executed in accordance with a program stored in the write block 32.

In FIG. 4, there is shown a process for explaining an operation when the CPU 30 is reset. That is to say, this process is effected after a reset signal 30e has been inputted into the terminal 50e. The reset signal is given from a reset circuit (not shown) in response to, for instance, the power supply voltage Vcc being applied to apparatus 40. The input/output operations to the terminals DI and DO are stopped under the reset state.

In FIG. 4, to permit operation of SCI 48, an initialization of the SCI is executed at a step Si.

At a step S2, a predetermined area of RAM 44, which is used for writing data into the PROM 31, is reset. It should be understood that a predetermined area of this RAM 44 implies at least an area for storing therein an address to execute a data writing operation for the PROM 31, and also an area required for storing therein others, e.g., a flag and the like.

At a step S3, the reset process jumps to a vector address which is used by a user during the reset in the PROM 31.

Thereafter, the reset process waits for an SCI interrupt for writing the data into PROM 31 at a step S4.

FIG. 5 is a flowchart for representing the SCI interrupt process.

First, output lines of the data transmitter 52 are connected to the terminals 50a and 50b. When a first SCI data signal is inputted, the SCI 48 detects the SCI interrupt. Upon occurrence of the SCI interrupt, a process for reading received data is performed at a step S10. At a step S11, a decision is made whether or not the write mode is in effect. This is achieved by determining whether or not a write mode signal 30e has been inputted from the data transmitter 52 to the input terminal 50e of the CPU 30. It should be noted that when the signal 30e is inputted into the terminal 50e, the CPU 30 automatically outputs the write mode signal as the $V_{PP}$ control signal 30d.

First, if the result at this step S11 is NO, namely it is determined that no write mode is selected, the SCI interrupt process is advanced to a step S12. At this step S12, a flag "prog flag" in RAM 44, representing that the PROM 31 is under writing operation, is reset, i.e. set to "zero". Also, the process jumps to the vector address in PROM 31 during the SCI interrupt operation for the user at a step S13. Under this state, the data of the CPU 30 may be communicated with the terminals within the automobile via the SCI 48, which may function as a sort of LAN (Local Area Network).

On the other hand, if the result at step S11 is YES, in other words a determination is made that it is the writing mode, a check is made of whether or not the "prog flag" has been set to "1" in RAM 44 at a step S14.

If the result at the step S14 is "NO", that is to say:

prog flag=0, then since this implies that this data corresponds to the first SCI data after the writing mode has been set, this data should be stored at the head address of the PROM 31.

Accordingly, the flag "prog flag" is set to "1" at step S15, and subsequently the head address of the PROM 31 is stored as a storage address for received data into RAM 44 at step S16, whereby the process is completed at this state. Under such a circumstance, the SCI data has not yet been stored into the PROM 31, and thus the data transmitter continues to output the same SCI data. As a consequence, the succeeding SCI data is inputted to the terminal 50a under this state, whereby an occurrence of the SCI interrupt is waited. Consequently, upon input of the succeeding SCI data, after the processes defined at the steps S10 and S11 are executed, the interrupt process is advanced to step S14.

Under this state, since the result at the step S14 is YES, namely:

prog flag=1, this implies that the operation has been set to the write mode, whereby the data is being written into the PROM 31. As a result, the interrupt process is advanced to steps S17 to S22 at this time.

First, at the step S17, the storage address of the PROM 31 which has been stored in RAM is read out, and the data received at the terminal 50a is written into this storage address. At the step S18, a check is made of whether or not a predetermined time period has passed. If the result is NO, then the process is returned to the step S17. This is because a lengthy time is required for writing the received data into the PROM 31. The measurement of the predetermined time period is carried out by way of a software timer employed in the CPU 30. If the result at the step S18 is YES, then the process is advanced to the step S19 at which the data at the storage address of the PROM 31, which has been stored therein at the previous step S17, is read out. A determination is made at step S20 of whether or not this data is identical to the data read at step S10. That is to say, it is determined whether all of the data read at the step S10 have been completely written into the PROM 31. If the writing operation is not yet accomplished, the process is returned to the step S17.

On the other hand, if the result at step S20 is YES, namely it is determined that a coincidence is established between these data, and thus the data writing operation has been completed, then at step S21 a data writing end signal 30c is sent out from the terminal 50c to an external device, i.e. the data transmitter 52 which is supplying the program data, and then commencement of transmission for the subsequent SCI data is demanded.

Subsequently, at step S22, the storage address of the PROM 31 is incremented by 1 for input of the SCI data, and then this process is completed.

As a result, upon input of the succeeding SCI data, the processes of steps S10, S11, S14, S17 and S22 are executed, and then this SCI data is stored at the incremented storage address. As previously explained, the program data are successively stored.

As a consequence, in accordance with the preferred embodiment shown in FIG. 3, since the program data may be written by the serial communication function, the total number of lands which need to be fabricated on the circuit board may be reduced so that the dimension of the entire circuit board may be small.

Furthermore, in accordance with this preferred embodiment, when a portion of the program data which have been written into the PROM 31 is to be modified, both the program data to be modified and the storage addresses thereof are inputted by the data transmitter 52 to the CPU 30, whereby such a program data modification may be readily achieved.

Also, if the PROM 31 may be driven under the power supply voltage "Vcc", the circuit elements 6 to 8, 33 and 34 may be omitted in this preferred embodiment, which is similar to the first preferred embodiment.

In accordance with the present invention, since the data writing operation can be performed after the CPU has been mounted on the circuit board, deformation of the leads of the CPU can be prevented, and also damage due to humidity absorbed by the CPU element can be minimized while writing the data into the PROM. Therefore, damage, e.g cracking, of the CPU's package may be avoided, various merits of the single chip CPU employing a PROM therein may be sufficiently achieved without lowering the reliability of the microcomputer control apparatus, and furthermore the microcomputer control apparatus of the present invention may be suitable for a so-called "multi-sort/small-quantity production" system.

Also, it is possible to employ such a method for the microcomputer control apparatus that after the CPU element has been packaged (soldered) on the circuit board, the pins of the checking apparatus are in contact with predetermined positions on the circuit board for supplying power thereto during the manufacturing stage, so as to confirm whether or not the circuit elements are suitably mounted on the circuit board and also to confirm that the correct types of circuit elements are mounted thereon. At this time, since the positions of the above-described pins are different from the circuit boards to be checked, namely different from the types of the control apparatuses, such a confirmation for the types may be achieved.

Accordingly, when the program data are written by utilizing such a checking apparatus after the types have been confirmed, erroneous program writing operation, namely erroneous CPU mounting of the different type, may be prevented, and moreover lowering the yield and increasing the manufacturing cost may be sufficiently suppressed while maintaining high reliability, according to the present invention.

As is apparent from the foregoing descriptions, the present invention is not limited to the above-described microcomputer control apparatuses, but may be applied to other control apparatuses.

Although the above-described preferred embodiments describe the program data writing operation, other data may be similarly written into the memory.

We claim:

1. A control apparatus for controlling an internal combustion engine of an automobile, said control apparatus comprising:

a circuit board having a plurality of input terminals and a plurality of output terminals;

a microcomputer mounted on said circuit board and having an input and an output, said input adapted for connection via a first one of said input terminals to a sensor, external to said circuit board, which senses an operating condition of the automobile, said output adapted for connection via one of said output terminals to an actuator, external to said circuit board, for controlling an operating condition of said internal combustion engine in accordance with the sensed operating condition;

program memory means in said microcomputer for storing a control program to control said microcomputer;

write control means mounted on said circuit board and responsive to a write control signal, for controlling said program memory means to permit writing of the control program into said program memory means;

input means mounted on said circuit board and connected to a second one of said input terminals for receiving from a source, external to said circuit board, the control program to be written into said program memory means when said program memory means is under control of said write control means; and isolation means mounted on said circuit board, connected to said microcomputer, to said first one of said input terminals, and to said one of said output terminals, and responsive to the write control signal, for electrically isolating said microcomputer from the sensor and the actuator when said write control means is controlling said program memory means, to inhibit input of signals from the sensor and output of signals to the actuator during writing of the control program into said program memory means.

2. A control apparatus for controlling an internal combustion engine of an automobile, said control apparatus comprising:

a circuit board having a plurality of input terminals and a plurality of output terminals;

a single chip microcomputer sealed in plastic, surface mounted on said circuit board, and having an input and an output, said input adapted for connection via a first one of said input terminals to a sensor, external to said circuit board, which senses an operating condition of the automobile, said output adapted for connection via one of said output terminals to an actuator, external to said circuit board, for controlling an operating condition of said internal combustion engine in accordance with the sensed operating condition;

program memory means in said microcomputer for storing a control program to control said microcomputer;

write control means surface mounted on said circuit board and responsive to a write control signal from said microcomputer, for controlling said program memory means to permit writing of the control program into said program memory means;

first input means surface mounted on said circuit board and connected to a second one of said input terminals for serially receiving from a source, external to said circuit board, a control program to be written into said program memory means when said program memory means is under control of said write control means;

serial communication interface means in said microcomputer for serially receiving the control program from said first input means; and second input means surface mounted on said circuit board and connected to a third one of said input terminals for receiving from a source, external to said circuit board, a write mode signal, wherein:

said microcomputer is responsive to the write mode signal to apply the write control signal to said write control means; and said write control means is responsive to the write control signal from said microcomputer, for controlling said program memory means to permit writing of the control program received by said serial communication interface means into said program memory means.

3. A control apparatus according to claim 2, wherein said microcomputer is adapted for operation in one of a write mode, for writing the control program received by said serial communication interface means into said program memory means, and a normal operation mode, for applying output signals to the actuator to control the operating condition of the engine, and wherein said write control means is further responsive to the write control signal from said microcomputer, to cause said microcomputer to operate in a selected one of the write mode and the normal operation mode.

4. A control apparatus according to claim 2, wherein said program memory means is a programmable read only memory.

5. A control apparatus according to claim 2, wherein said one of said output terminals is adapted for connection to an ignition coil of the internal combustion engine.

6. A control apparatus according to claim 2, wherein said one of said output terminals is adapted for connection to a fuel injector of the internal combustion engine.

7. A control apparatus according to claim 2, wherein said write control means comprises switching means responsive to the write control signal for applying a voltage signal to said program memory means, and said program memory means is responsive to the voltage signal to permit writing of the control program in said program memory means.

* * * * *